United States Patent [19]

Bajor et al.

[11] Patent Number: 4,606,936
[45] Date of Patent: Aug. 19, 1986

[54] STRESS FREE DIELECTRIC ISOLATION TECHNOLOGY

[75] Inventors: George Bajor, Melbourne; Charles Messmer, Palm Bay, both of Fla.

[73] Assignee: Harris Corporation, Melbourne, Fla.

[21] Appl. No.: 723,581

[22] Filed: Apr. 12, 1985

[51] Int. Cl.⁴ .............................................. H01L 21/76
[52] U.S. Cl. .................................. 427/85; 29/576 W; 29/580; 427/86
[58] Field of Search ............... 427/85, 86; 29/576 W, 29/580

[56] References Cited

U.S. PATENT DOCUMENTS

| | | | |
|---|---|---|---|
| 4,079,506 | 3/1978 | Suzuki | 427/95 |
| 4,191,603 | 3/1980 | Garbarino | 427/86 |
| 4,251,571 | 2/1981 | Garbarino | 427/93 |
| 4,279,671 | 7/1981 | Komatsu | 427/86 |
| 4,310,965 | 1/1982 | Horiuchi | 427/93 |

OTHER PUBLICATIONS

Suzuki et al., "Deformation in Dielectric-Isolated Substrates and its Control by a Multilayer Polysilicon Support Structure" J. Electrochem. Soc.: Solid-State Science and Technology, vol. 127, No. 7, Jul. 1980, pp. 1537-1542.

Kern et al., "Advances in Deposition Processes for Passivation Films" J. Vac. Sci. Technol., vol. 14, No. 5, Sep./Oct. 1977, pp. 1032-1062.

Davidson et al., "Dielectric Isolated Integrated Circuit Substrate Processes" Proceedings of the IEEE, vol. 57, No. 9, Sep. 1969, pp. 1532-1539.

Primary Examiner—John D. Smith
Attorney, Agent, or Firm—Thomas N. Twomey; Charles C. Krawczyk

[57] ABSTRACT

Stress is eliminated between a dielectrically passivated silicon wafer and a thick polycrystalline silicon layer by depositing a low melting transition layer such as a doped silica glass over the passivated silicon wafer.

24 Claims, 11 Drawing Figures

STRESS FREE DIELECTRIC ISOLATION TECHNOLOGY

BACKGROUND OF THE INVENTION

This invention relates to the elimination of stress between a dielectrically passivated substrate and an overlying semiconductor material. More specifically, this invention relates to the elimination of stress between a dielectrically passivated silicon wafer and a thick polycrystalline silicon layer which is deposited on the silicon wafer.

One of the main processing steps associated with dielectric isolation technology is the deposition of a thick polycrystalline silicon layer onto an oxidized surface of a silicon wafer. During this deposition, the polysilicon film tends to densify, which in turn generates a substantial residual stress between the polysilicon film and the dielectrically passivated silicon wafer. FIG. 1 illustrates the structure of the prior art which consists of a silicon substrate 10, a passivation layer 20, typically of silicon dioxide and polysilicon layer 60. In this structure, substantial residual stress is formed between layers 60 and 20.

This residual stress is harmful to final semiconductor products built from such starting materials because of the possibility that the stress can cause warping of the wafer which is one of the main causes of reduced yield during production. Additionally, microcracks and voids in device patterns, difficulties in subsequent mask alignment and degradation of the electrical parameters of semiconductor devices are all caused in part by excessive stress existing between the polysilicon film and the underlying wafer.

By reducing the ill effects of the stress thus formed it is possible to substantially improve the detrimental effects on final device yield.

It has been previously known that the significant stress which is created between a polysilicon film and the dielectrically passivated semiconductor wafer is detrimental to final device fabrication. This has been described in several publications including U. S. Davidson and F. Lee, "Dielectric-Isolated Integrated Circuit Substrate Process", Proc. IEEE, Volume 57, 1532 (1969) and T. Suzuki, et al., "Deformation in Dielectric Isolated Substrates and Its Control by a Multilayer Polysilicon Support Structure", J. Electrochem. Soc., Volume 127, 1573 (1980).

The relatively low softening temperature of a heavily doped silicon dioxide, e.g. phospho-silica glass or boro silica glass is known as was discribed in S. K. Gandhi, "VLSI Fabrication Principles" (1983), J. Wiley and Sons, Inc., Page 66. Because of the relatively low softening temperature of such glasses, the phospho-silica glass has been used in VLSI Technology to form tapered via holes. This use of phospho-silica glass is disclosed in W. Kern and R. S. Rosler, J. Vac. Sci. and Tech., Volume 14, 1082 (1977).

SUMMARY OF THE INVENTION

In order to overcome the difficulties associated with the stress causing junction between a semiconductor wafer and a polysilicon film, it has become necessary to find a simple and inexpensive method for permitting high quality and high yield semiconductor processing. According to the present invention, the stress existing between the passivated wafer and polysilicon film can be minimized by depositing a heavily doped silicon dioxide film onto the dielectrically passivated silicon wafer surface prior to deposition of the polysilicon film. Unrestricted densification of the polysilicon can then occur without damage to device integrity because the heavily doped oxide acts as a "Pseudo-Liquid" interface between the polysilicon and the undoped oxide layer on the substrate. In this manner the doped oxide film allows contraction of the polysilicon layer without causing any mechanical stress in the silicon wafer.

FIG. $4_a$, $4_b$, $4_c$ is an illustration showing the various process stages of the invention.

DETAILED DESCRIPTION OF THE INVENTION

Figure 1:
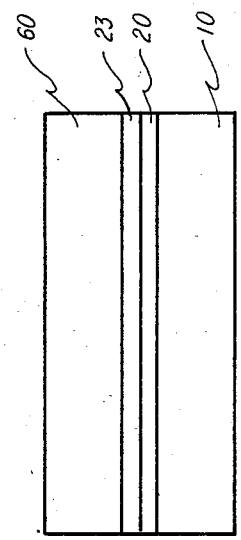
FIG. 1 is a cross sectional view of the structure of the prior art.
Figure 2:
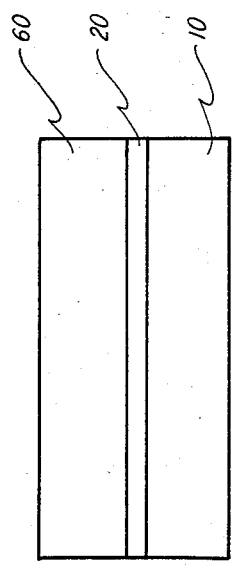
FIG. 2 is a cross sectional view of a stress free dielectrically isolated structure made in accordance with the invention.

The present invention is illustrated in a general sense in FIG. 2 where a stress free, multilayer structure is shown. A substrate 10 is provided, preferably of silicon having a (100) orientation, but recognizing that any crystalline material or orientation intended for use in a dielectrically isolated product can benefit from this invention. Typically, this substrate 10 will be approximately 500 μm thick. A dielectrically passivating layer 30 is provided on the substrate. In the preferred practice of the invention, the substrate is silicon, thus, a silicon dioxide passivating layer 30 can be formed by thermal oxidation at a temperature range of 1000°–1200° C. In a preferred process, the dielectrically passivating layer will be between about 1 and 3 micrometers thick. A transition layer 23, preferably of doped silica glass having a low softening temperature, is provided on said dielectrically passivating layer and a polycrystalline layer 60 preferably of silicon is deposited on the transition layer 23 at a temperature above the softening temperature of the transition layer 23. It is desired that the transition layer have a softening temperature substantially lower than the deposition temperature of the subsequently applied poly-crystalline silicon layer 60 to permit densification during the deposition process without creating stress between the transition layer 23 and the densifying polycrystalline layer 60.

Figure 3:
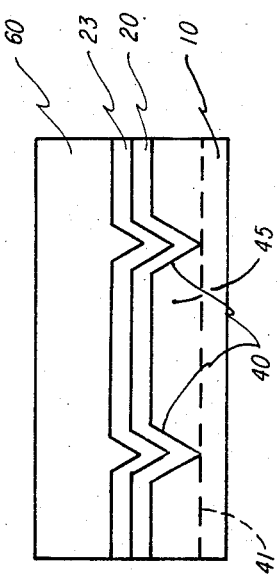
FIG. 3 is a cross sectional view of an intermediate stage in the formation of a dielectrically isolated semiconductor product.
Figure 4A:
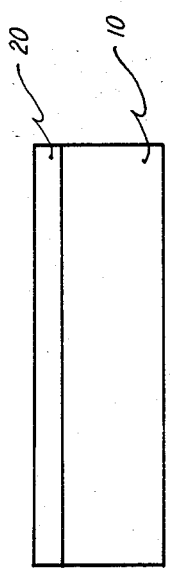
Figure 4B:
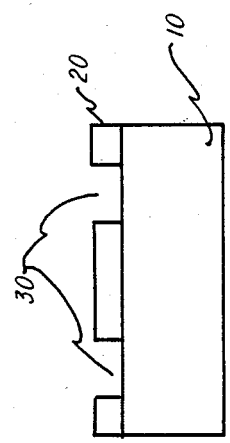
Figure 4C:
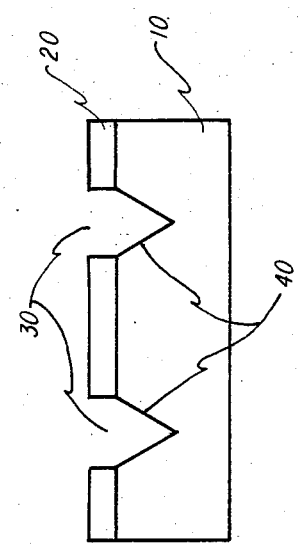
Figure 4D:
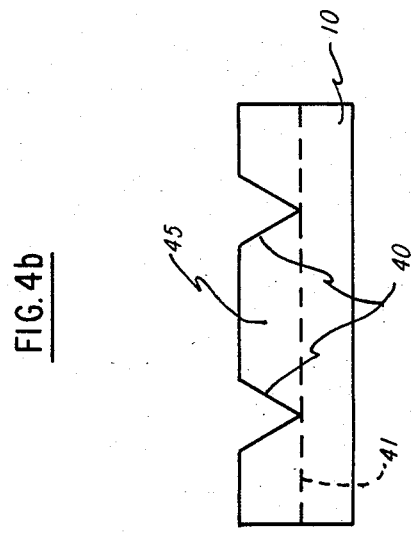
Figure 4E:
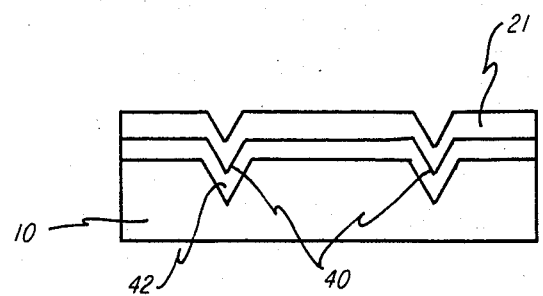
Figure 4F:
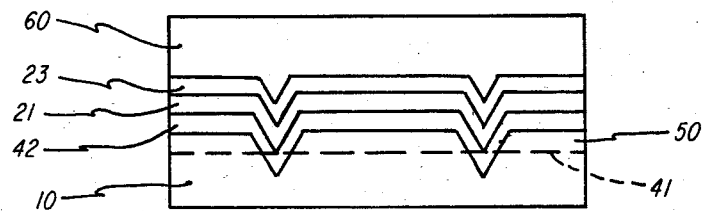
Figure 4G:
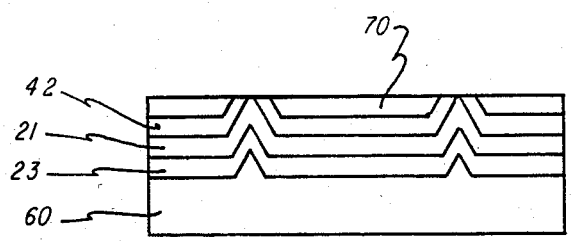

An example of a structure which is subject to the stresses caused by application of a polysilicon layer on a silicon substrate is illustrated in FIG. 3 wherein an intermediate step in the formation of dielectrically isolated islands is shown. A silicon substrate 10 having grooves 40 is shown with a dielectrically passivating layer 20 covering the substrate, including the grooves 40 to provide a complete dielectric coating over the substrate. The region 45 in the substrate which is between the grooves 40 40 will eventually become the dielectrically isolated islands.

Next, a transition layer 23 of highly doped silica glass is provided, preferably by chemical vapor deposition. A suitable doped glass comprises phospho-silica glass containing approximately 10% phosphorous. This glass can be deposited by chemical vapor deposition at a temperature range of 300°–500° C. A layer of between about 500 and 10,000 Angstroms is formed in approximately 10 minutes and will provide a suitable transition layer. Directly on this layer, a polysilicon layer 60 is deposited by chemical vapor deposition at a temperature above 1100° C. At this temperature the transition layer is softened thus allowing for crystal formation and growth in the polysilicon layer without creating any substantial interlayer stress at the interface with the transition layer. During the crystal formation in the polysilicon, there is densification of the polycrystalline material resulting in shrinkage of the polycrystalline layer. Previously, when the polysilicon was applied directly to the dielectrically passivating layer, this densification created substantial interlayer stress and resulted in bending or warping of the final wafer. Upon coating of the polysilicon layer, the transition layer hardens and a stress free interface remains.

Referring now to FIGS. $4_a$–$4_g$ the preferred manner of forming dielectrically isolated islands in a DI wafer is described. As shown in FIG. $4_a$, a silicon wafer 10 preferably having a (100) orientation is selected and an oxide 20 is grown by thermal oxidation, preferably to a thickness of about 2 micrometers. Typically, the silicon wafer will have a thickness of about 500 micrometers. FIG. $4_b$ illustrates the structure formed as described above and further shows apertures 30 where the oxide has been removed. The apertures 30 are formed by a photolithographic process followed by a conventional wet etch. As shown in FIG. $4_c$, grooves 40 are formed in the silicon wafer at the locations of apertures 30. In this manner, it is possible to obtain uniform groove depth. Following groove formation the remaining oxide 20 is stripped and as shown in FIG. $4_d$, the substrate 10 has a plurality of grooves 40 which define regions 45 in the substrate betwen the grooves and above the depth of the grooves as shown by dashed line 41.

FIG. $4_e$ shows the N+ layer 42 formed along the entire exposed surface of substrate and the oxide layer 21 which is grown by thermal oxidation along the entire substrate surface, including the surface of grooves 40. Preferably the N+ layer is formed by diffusion and will form a buried layer. The oxide layer 21 is a dielectric passivating layer. Acceptable alternative to the use of silicon oxide as the dielectric passivating layer include silicon nitride and aluminum oxide, but any other dielectric material could be used. A transition layer 23 of highly doped silica glass is deposited by chemical vapor deposition on the dielectric passivating layer 21 as shown in FIG. $4_f$. The transition layer may contain any dopant which substantially reduces the melting temperature of silica glass without causing excessive migration or diffusion of dopants into the substrate. Acceptable alternatives to the previously described phospho-silica glass include boro-silica and arseno-silica glass. In each case, it is the reduced melting temperature imparted to the glass which renders these dopants desirable. Then, at a temperature above the softening temperature of the transition layer 23, a layer 60 of polycrystalline silicon is deposited by chemical vapor deposition. The polysilicon layer 60 is deposited at a temperature of between about 1100° C. and 1250° C. At this temperature, the transition layer 23 of phospho-silica glass, containing approximately 10% phosphorous, is in a pseudo-liquid state. This permits unrestricted densification of the polysilicon without the creation of any substantial stress between the silicon wafer 10 and the polysilicon layer 60. The polysilicon layer 60 may preferably be formed with a thickness of about 500 micrometers and the transition layer is optionally between about 0.05 micrometers and 1 micrometer thick.

Figure 5:
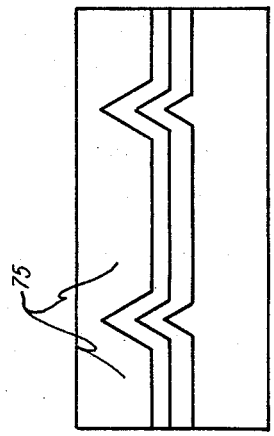

The structure so formed is then inverted for subsequent processing as shown in FIG. $4_g$. The surface is ground and polished along dashed line 41 to expose the "bottoms" of the grooves 40. As shown, it is typically easier to slightly exceed the depth necessary to reach the line 41 and this insures that the dielectric material of each groove is exposed. It is at this step that the prior bending and warping of DI wafers presented the most severe problem. If the wafer is sufficiently non-planar due to interlayer stresses, the grinding and polishing steps would not consistently result in the exposure of every groove. Thus, rather than forming isolated islands 70 as shown in FIG. $4_g$, non-isolated regions 75 result as shown in FIG. 5.

Every attempt is made to reduce the variations from planarity prior to the grinding and polishing step, thus, it has been found that some slight variations can be overcome by securing the wafers to a vacuum chuck during the grinding and polishing steps.

In some instance, the dopant contained in the transition layer may not be sufficiently masked from the silicon islands by the 2 micrometer thick dielectrically passivating layer. Particularly, this may occur when the dopant is phosphorous and the dielectrically passivating layer is silicon dioxide. The masking properties of the oxide will be particularly suspect during high temperature processing. To avoid any detrimental effects of dopant diffusion during high temperature processing, an additional mask layers for instance of silicon nitride, may be deposited on the dielectric layer to mask against diffusion at the dopants contained in the transition layer.

What is claimed is:

1. In the manufacture of polysilicon supported substrates containing dielectrically isolated islands a process for forming a stress free interface between a dielectrically passivated silicon substrate and a polysilicon layer formed by chemical vapor deposition comprising the steps of selecting a silicon substrate,
   forming a dielectric layer directly on the surface of said silicon substrate,
   depositing a layer of doped silica glass directly on the surface of said dielectric layer,
   depositing, by chemical vapor deposition directly on the surface of said layer of doped silica glass at a temperature above the softening temperature of said doped-silica glass, a thick polysilicon layer, thus forming a multilayer structure, and cooling the multilayer structure below the softening temperature of said doped-silica glass.

2. A process as claimed in claim 1 wherein:
   said doped-silica glass contains approximately 10 mole % phosphorous and said layer of doped silica glass is between about 500 and 10,000 angstroms thick.

3. A process as claimed in claim 2 wherein:
   said depositing of a polysilicon layer is at a temperature of between about 1100° and 1250° C., and
   said polysilicon layer is deposited to a thickness of about 500 micrometers.

4. A process as claimed in claim 3 wherein the softening temperature of said doped silica glass is about 1000° C.

5. A process as claimed in claim 4 wherein:
   said dielectric layer comprises an oxide of silicon covered by silicon nitride.

6. In the manufacture of dielectrically isolated single crystal islands comprising a single crystal layer formed from a single crystal silicon substrate supported by a chemical vapor deposited polycrystalline silicon layer an improved process for eliminating stress between said silicon substrate and said chemical vapor deposited polycrystalline silicon layer comprising the steps of providing a dielectrically passivated silicon substrate depositing over said substrate by chemical vapor deposition a layer of polycrystalline silicon at a first temperature and providing a transition layer between said substrate and said layer of polycrystalline silicon said transition layer having a softening temperature lower than said first temperature.

7. A process as claimed in claim 6 wherein said transition layer is in direct contact with said dielectrically passivated silicon substrate and said polycrystalline layer over substantially the entire area of said transition layer.

8. A process as claimed in claim 6 wherein said polycrystalline layer is deposited over substantially the entire area of said substrate.

9. A process as claimed in claim 8 wherein said transition layer is in direct contact with said dielectrically passivated silicon substrate and said polysilicon layer over substantially the entire area of said transition layer.

10. A process as claimed in claim 9 wherein said transition layer is provided over substantially the entire area of said substrate prior to the deposition of said polysilicon layer.

11. A process as claimed in claim 6 wherein said silicon substrate includes a pattern of grooves for defining dielectrically isolated islands and further comprises a dielectric passivating layer comprising silicon dioxide which substantially covers said grooves.

12. A process as claimed in claim 11 wherein said transition layer has a thickness of between about 0.05 micrometers and 1 micrometer.

13. A process as claimed in claim 11 wherein said polycrystalline silicon layer is thick.

14. A process as claimed in claim 13 wherein said polycrystalline layer has a thickness of about 500 micrometers.

15. An improved process for the formation of wafers containing dielectrically isolated islands comprising the steps of:

selecting a crystalline silicon wafer having first and second sides, providing on said first side of said wafer a pattern of grooves for defining dielectrically isolated islands, providing a dielectric coating over said first side of said wafer, said dielectric coating covering said grooves, providing a thin transition layer having a first softening temperature over substantially the entire surface of said dielectric coating, forming over and substantially covering said transition layer, at a temperature above said first softening temperature, a thick polycrystalline layer, processing said second side of said wafer to expose said grooves thereby isolating said defined isolated islands.

16. The process as claimed in claim 15 wherein said step of processing said second side of said wafer comprises grinding and polishing the surface of said second side of said wafer to a depth sufficient to expose said entire pattern of grooves.

17. The process as claimed in claim 15 wherein said transition layer has a thickness of between about 0.05 micrometers and 1 micrometer.

18. The process as claimed in claim 15 wherein said polycrystalline layer has a thickness of about 500 micrometers.

19. The process as claimed in claim 15 wherein said thick polycrystalline layer comprises polycrystalline silicon of sufficient thickness to provide physical support for said dielectrically isolated islands.

20. The process as claimed in claim 15 wherein said step of forming over and substantially covering said transition layer is further characterized in that said thick polycrystalline layer is formed directly on said transition layer.

21. The process as claimed in claim 15 wherein said step of forming over the substantially covering said transition layer is further characterized in that said thick polycrystalline layer is formed by chemical vapor deposition at a temperature above 1100° C.

22. The process as claimed in claim 15 wherein said step of providing a thin transition layer comprises chemical vapor deposition of a layer of between about 500 Angstrom and 10,000 Angstroms of phospho-silica glass containing approximately 10% phosphorous at a temperature of between about 300° C. and about 500° C.

23. The process as claimed in claim 22 wherein said step of forming over and substantially covering said transition layer is further characterized in that said thick polycrystalline layer is formed by chemical vapor deposition at a temperature above 1100° C.

24. In a process for the formation of dielectrically isolated island containing wafers including the steps of depositing a dielectric layer on a first side of a crystalline semiconductor substrate containing grooves defining regions where a plurality of dielectric islands will be formed, said dielectric layer substantially covering said grooves, depositing a thick polycrystalline layer over said dielectric layer, and processing a second side of said substrate to remove the surface of said second side to a depth sufficient to expose said dielectrically filled grooves and thereby dielectrically isolate said plurality of islands, the improvement comprising:

forming over said dielectric layer a layer of doped silica glass having a softening temperature, and depositing said thick polycrystalline layer by chemical vapor deposition directly on said layer of doped silica glass at a temperature above said softening temperature.

* * * * *